(12) United States Patent
Eagen et al.

(10) Patent No.: US 10,330,745 B2
(45) Date of Patent: Jun. 25, 2019

(54) MAGNETIC FIELD SENSOR WITH IMPROVED RESPONSE IMMUNITY

(71) Applicant: Allegro MicroSystems, LLC, Manchester, NH (US)

(72) Inventors: Jeffrey Eagen, Manchester, NH (US); William P. Taylor, Amherst, NH (US)

(73) Assignee: Allegro MicroSystems, LLC, Manchester, NH (US)

( * ) Notice: Subject to any disclaimer, the term of this patent is extended or adjusted under 35 U.S.C. 154(b) by 0 days.

(21) Appl. No.: 16/136,692

(22) Filed: Sep. 20, 2018

(65) Prior Publication Data
US 2019/0018081 A1 Jan. 17, 2019

Related U.S. Application Data

(63) Continuation of application No. 15/061,190, filed on Mar. 4, 2016, now Pat. No. 10,114,085.

(51) Int. Cl.
*G01R 33/09* (2006.01)
*G01D 5/16* (2006.01)
*G01R 15/20* (2006.01)
*G01D 5/14* (2006.01)
*G01D 5/244* (2006.01)

(52) U.S. Cl.
CPC ............. *G01R 33/09* (2013.01); *G01D 5/145* (2013.01); *G01D 5/16* (2013.01); *G01D 5/24438* (2013.01); *G01R 15/205* (2013.01); *G01R 33/093* (2013.01); *G01R 33/098* (2013.01)

(58) Field of Classification Search
CPC ........................................................ G01R 33/09
USPC ....................................................... 324/207.21
See application file for complete search history.

(56) References Cited

U.S. PATENT DOCUMENTS 5,731,702 A * 3/1998 Schroeder ............ G01D 5/2492
123/617
5,861,747 A 1/1999 Kubinski
(Continued)

FOREIGN PATENT DOCUMENTS

DE 198 39 446 3/2000

OTHER PUBLICATIONS

Communication pursuant to Rules 161(1) and 162 EPC dated Oct. 16, 2018 for European Application No. 17709292.1; 3 Pages.
(Continued)

*Primary Examiner* — Reena Aurora
(74) *Attorney, Agent, or Firm* — Daly, Crowley, Mofford & Durkee, LLP

(57) ABSTRACT

A magnetic field sensor includes a plurality of magnetoresistance elements, each having at least one characteristic selected to provide a respective, different response to an applied magnetic field, wherein each of the plurality of magnetoresistance elements is coupled in parallel. Illustrative characteristics selected to provide the respective responses include dimensions and/or construction parameters such as materials, layer thickness and order, and spatial relationship of the magnetoresistance element to the applied magnetic field. A method includes providing each of a plurality of magnetoresistance elements with at least one characteristic selected to provide a respective, different response to an applied magnetic field, wherein each of the plurality of magnetoresistance elements is coupled in parallel.

27 Claims, 6 Drawing Sheets

(56) References Cited

U.S. PATENT DOCUMENTS

| | | | |
|---|---|---|---|
| 6,169,396 B1 * | 1/2001 | Yokotani | G01D 5/147 324/207.12 |
| 6,486,659 B1 * | 11/2002 | Schroeder | G01D 5/145 324/207.12 |
| 6,498,482 B2 * | 12/2002 | Schroeder | G01D 5/147 324/207.21 |
| 7,768,083 B2 | 8/2010 | Doogue et al. | |
| 7,777,607 B2 | 8/2010 | Taylor et al. | |
| 7,924,534 B2 | 4/2011 | Grimm et al. | |
| 8,629,520 B2 | 1/2014 | Doogue et al. | |
| 8,791,692 B2 | 7/2014 | Furukawa et al. | |
| 8,878,531 B2 | 11/2014 | Ausserlechner et al. | |
| 8,952,471 B2 | 2/2015 | Doogue et al. | |
| 9,082,957 B2 | 7/2015 | Doogue et al. | |
| 9,891,293 B2 * | 2/2018 | Kawakami | G01R 33/09 |
| 10,114,085 B2 | 10/2018 | Eagen et al. | |
| 2014/0111195 A1 | 4/2014 | Kuo et al. | |

OTHER PUBLICATIONS

Preliminary Amendment for U.S. Appl. No. 16/055,644, filed Nov. 5, 2018; 8 Pages.
Notice of Allowance dated Jul. 13, 2018 for U.S. Appl. No. 15/061,190; 8 Pages.
Office Action dated Sep. 8, 2017 for U.S. Appl. No. 15/061,190; 16 Pages.
Office Action dated Feb. 23, 2018 for U.S. Appl. No. 15/061,190; 21 Pages.
Response to Office Action dated Sep. 8, 2017 for U.S. Appl. No. 15/061,190, filed Oct. 12, 2017; 13 Pages.
Response to Office Action dated Feb. 23, 2018 for U.S. Appl. No. 15/061,190, filed Apr. 17, 2018; 12 Pages.
Search Report and Written Opinion dated May 22, 2017 for PCT Application No. PCT/US2017/019197; 13 pages.
U.S. Appl. No. 16/055,644, filed Aug. 6, 2018, Lassalle-Balier et al.

* cited by examiner

MAGNETIC FIELD SENSOR WITH IMPROVED RESPONSE IMMUNITY

CROSS REFERENCE TO RELATED APPLICATIONS

The present application is a continuation of U.S. patent application Ser. No. 15/061,190 filed Mar. 4, 2016 and entitled "MAGNETIC FIELD SENSOR WITH IMPROVED RESPONSE IMMUNITY," which is incorporated herein by reference.

STATEMENT REGARDING FEDERALLY SPONSORED RESEARCH

Not Applicable.

FIELD

This disclosure relates generally to magnetic field sensors, and more particularly, to a magnetic field sensor having an improved response immunity.

BACKGROUND

As is known, sensors of various types are used in a variety of applications. Sensors including one or more sensing elements (e.g., pressure sensing elements, temperature sensing elements, light sensing elements, acoustic sensing elements, and magnetic field sensing elements) are used to detect one or more parameters (e.g., pressure, temperature, light, sound, magnetic field). Magnetic field sensors, for example, are circuits including one or more magnetic field sensing elements, generally in combination with other circuit components (e.g., analog, digital and/or mixed signal components), and are used to detect a magnetic field.

In motion (e.g., rotation) detectors, for example, a magnetic field sensor may be used to detect motion of an object, such as a ferromagnetic object, for example, a gear or ring magnet. A magnetic field associated with the object is typically detected by one or more magnetic field sensing elements, such as Hall effect elements and/or magnetoresistance elements, which provide a signal (i.e., a magnetic field signal) proportional to an applied magnetic field.

Magnetic field sensing elements are typically sensitive to magnetic field strength and temperature. A magnetic field sensing element's response to an applied magnetic field (e.g., a magnetic field as may be affected by motion of a ferromagnetic object) may, for example, be a function of various factors including design parameters, such as materials, layer thickness and other dimensions, etc. Manufacturing tolerances and/or defects or irregularities (e.g., layer thickness or layer quality defects) formed during manufacture and/or use of magnetic field sensing elements may adversely affect a magnetic field sensing element's expected response (e.g., change in resistance) to an applied magnetic field and, thus, adversely affect the reliability of a resulting device (e.g., motion detector) in which the magnetic field sensing elements are provided.

In high precision sensing applications such as automobiles, accuracy in magnetic field sensing, such as may be used to detect motion of a target object, can be critical. Engine ignition timing, for example, depends on consistent detection accuracy. When magnetic field sensing elements of a magnetic field sensor integrated circuit (IC) in an engine ignition timing system respond to a magnetic field in an unknown and/or undesirable manner, detection accuracy by the magnetic field sensor IC, and the resulting accuracy or performance of the engine ignition timing system, can be negatively impacted (e.g., due to sudden unexpected changes in an output of magnetic field sensing elements).

SUMMARY

Described herein are concepts, systems, circuits and techniques related to a magnetic field sensor and a method for providing such a sensor with an improved response to an applied magnetic field and therefore improved sensing. More particularly, the resulting response can exhibit immunity to certain response deviations.

In one aspect of the concepts described herein, a magnetic field sensor includes a plurality of magnetoresistance elements, each having a respective length and width selected to provide a respective, different response to an applied magnetic field, wherein each of the plurality of magnetoresistance elements is coupled in parallel. With this arrangement, a condition causing an unexpected or undesirable response in one of the plurality of magnetoresistance elements will have a reduced impact on the magnetic field sensor accuracy.

The magnetic field sensor may include one or more of the following features individually or in combination with other features. A width of a first one of the plurality of magnetoresistance elements is different than and a multiple of a width of a second one of the plurality of magnetoresistance elements, and wherein a length of the first one of the plurality of magnetoresistance elements is the same as a length of the second one of the plurality of magnetoresistance elements. The respective, different responses of the plurality of magnetoresistance elements to the applied magnetic field may differ in linearity. Each of the plurality of magnetoresistance elements may have a substantially similar resistance when the applied magnetic field has a magnetic field strength of about zero Gauss. At least one of the plurality of magnetoresistance elements may experience a non-linear response to the applied magnetic field. At least two of the plurality of magnetoresistance elements may experience a non-linear response to the applied magnetic field. The non-linear response may be a result of a magnetic domain. The non-linear response experienced may also be a result of the applied magnetic field having a strength greater than a predetermined level.

The width of the first one of the plurality of magnetoresistance elements may also be approximately one-half the width of a second one of the plurality of magnetoresistance elements.

Each of the plurality of magnetoresistance elements may have a respective construction and the respective construction may comprise the at least one characteristic selected to provide the respective, different responses to the applied magnetic field. The respective construction may include one or more of: a material of one or more layers of the magnetoresistance element, a thickness of one or more layers of the magnetoresistance element, an ordering of one or more layers of the magnetoresistance element, and a spatial relationship of the magnetoresistance element with respect to the applied magnetic field. The plurality of magnetoresistance elements may be coupled in a bridge configuration.

The magnetic field sensor may include processing circuitry responsive to a magnetic field signal generated by the plurality of magnetoresistance elements in response to the applied magnetic field and configured to provide an output signal of the magnetic field sensor indicative of the applied magnetic field. The output signal of the magnetic field sensor may be indicative of one or more of a strength of the applied magnetic field, an angle of the applied magnetic field, a current associated with the applied magnetic field, and a speed and/or direction of movement of a ferromagnetic element that affects the applied magnetic field.

The magnetic field sensor may include processing circuitry responsive to a plurality of magnetic field signals, each generated by a respective one or more of the plurality of magnetoresistance elements in response to the applied magnetic field and configured to provide an output signal of the magnetic field sensor indicative of the applied magnetic field. The output signal of the magnetic field sensor may be indicative of one or more of a strength of the applied magnetic field, an angle of a direction of the applied magnetic field, a current associated with the applied magnetic field, and a movement of a ferromagnetic element that affects the applied magnetic field. The magnetic field sensor may be a current sensor.

The plurality of magnetoresistance elements may include one or more of a giant magnetoresistance (GMR) element, a magnetic tunnel junction (MTJ) element and a tunneling magnetoresistance (TMR) element. The plurality of magnetoresistance elements may include an anisotropic magnetoresistance (AMR) element. The magnetic field sensor may include a plurality of current sources, each coupled to one or more of the plurality of magnetoresistance elements. The magnetic field sensor can further include a controller configured to sample an output of each magnetoresistance element and provide an output signal as long as the outputs of each of the magnetoresistance elements respond in a similar manner to the applied magnetic field.

In another aspect of the concepts described herein, a method includes providing each of a plurality of magnetoresistance elements with at least one characteristic selected to provide a respective, different response to an applied magnetic field, wherein each of the plurality of magnetoresistance elements is coupled in parallel.

The method may include one or more of the following features either individually or in combination with other features. A width of a first one of the plurality of magnetoresistance elements is different than and a multiple of a width of a second one of the plurality of magnetoresistance elements, and wherein a length of the first one of the plurality of magnetoresistance elements is the same as a length of the second one of the plurality of magnetoresistance elements. Providing each of a plurality of magnetoresistance elements may include providing the each of the plurality of magnetoresistance elements with a response to the applied magnetic field that differs in linearity. Providing each of a plurality of magnetoresistance elements may include providing at least one magnetoresistance element that experiences a non-linear response to the applied magnetic field. Providing each of a plurality of magnetoresistance elements may include providing at least two magnetoresistance elements that experience a non-linear response to the applied magnetic field.

Providing each of a plurality of magnetoresistance elements may include coupling the plurality of magnetoresistance elements in a bridge configuration. The method may include providing a plurality of current sources, each coupled to one or more of the plurality of magnetoresistance elements. The method may include sampling an output of each magnetoresistance element and providing an output signal as long as the outputs of each of the magnetoresistance elements respond in a similar manner to the applied magnetic field.

BRIEF DESCRIPTION OF THE DRAWINGS

The foregoing features of the disclosure, as well as the disclosure itself may be more fully understood from the following detailed description of the drawings, in which.

DETAILED DESCRIPTION

Figure 1:
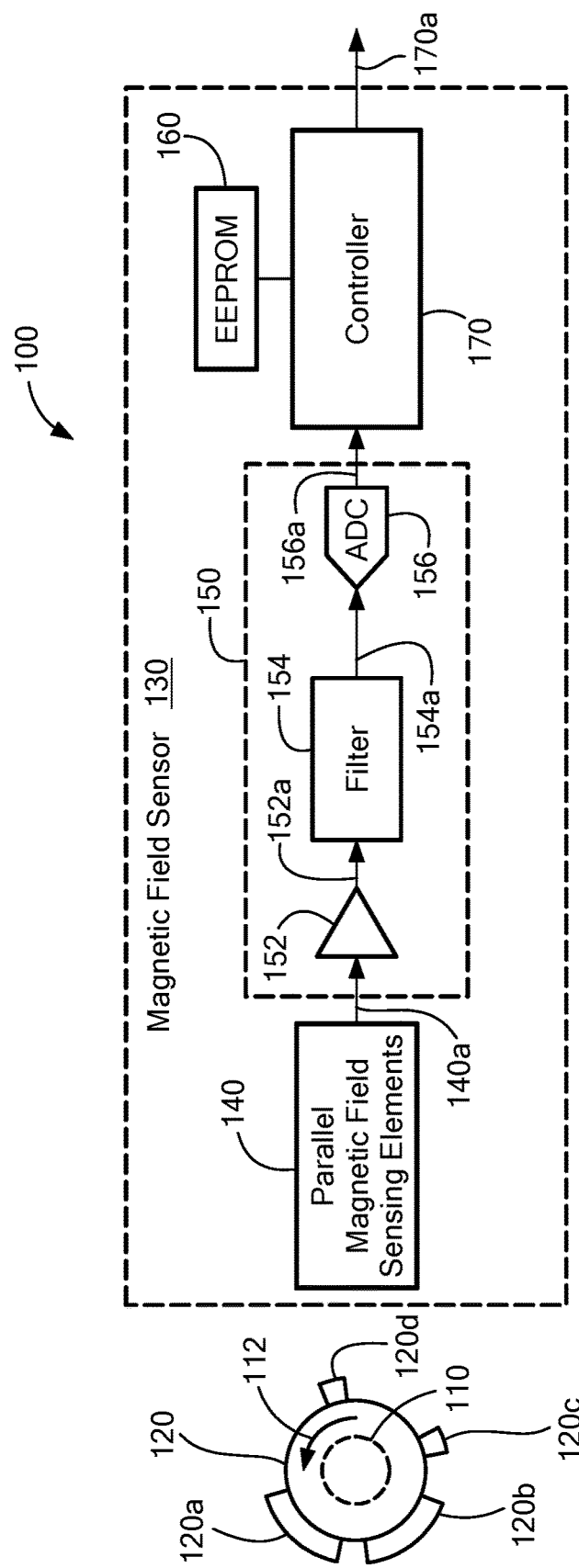
FIG. 1 is a block diagram of an example magnetic field sensor comprising a plurality of magnetoresistance elements according to the disclosure.

The features and other details of the concepts, systems, and techniques sought to be protected herein will now be more particularly described. It will be understood that any specific embodiments described herein are shown by way of illustration and not as limitations of the disclosure and the concepts described herein. Features of the subject matter described herein can be employed in various embodiments without departing from the scope of the concepts sought to be protected. Embodiments of the present disclosure and associated advantages may be best understood by referring to the drawings, where like numerals are used for like and corresponding parts throughout the various views. It should, of course, be appreciated that elements shown in the figures are not necessarily drawn to scale. For example, the dimensions of some elements may be exaggerated relative to other elements for clarity.

For convenience, certain introductory concepts and terms used in the specification are collected here.

As used herein, the term "magnetic field domain" is used to describe a region within a magnetic field sensing element in which magnetization of the magnetic material is in a uniform direction. In other words, individual magnetic moments of atoms within the magnetic material are aligned with each other in the region with the magnetic material and point in a same direction within the magnetic material. When a magnetic domain is aggravated and individual magnetic moments of atoms within a magnetic material are no longer aligned and pointing in a same direction (e.g., due to the magnetic material being subjected to a magnetic field having a having a strength greater than a predetermined level), the magnetic domain can cause the magnetic material and, thus, a magnetic field sensing element including the magnetic material, to have a non-linear response (e.g., experience a sudden jump in resistance) to an applied magnetic field.

As used herein, the term "magnetic field sensor" is used to describe a circuit that uses one or more magnetic field sensing elements, generally in combination with other components and/or circuits. Magnetic field sensors are used in a variety of applications, including, but not limited to, an angle sensor that senses an angle of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or features of a ferromagnetic target (e.g., gear teeth) where the magnetic field sensor is used in combination with a back-biased or other magnet, and a so-called linear magnetic field sensor that senses a magnetic field density of a magnetic field.

As used herein, the term "magnetic field sensing element" is used to describe a variety of electronic elements that can sense a magnetic field. The magnetic field sensing element can be, but is not limited to, a magnetoresistance element, a Hall effect element, or a magnetotransistor. As is known, there are different types of magnetoresistance (MR) elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). As is also known, there are different types of Hall effect elements, for example, a planar Hall element, a vertical Hall element, and a Circular Vertical Hall (CVH) element. The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As used herein, the term "processor" is used to describe an electronic circuit that performs a function, an operation, or a sequence of operations. The function, operation, or sequence of operations can be hard coded into the electronic circuit or soft coded by way of instructions held in a memory device. A "processor" can perform the function, operation, or sequence of operations using digital values or using analog signals.

In some embodiments, the "processor" can be embodied, for example, in a specially programmed microprocessor, a digital signal processor (DSP), or an application specific integrated circuit (ASIC), which can be an analog ASIC or a digital ASIC. Additionally, in some embodiments the "processor" can be embodied in configurable hardware such as field programmable gate arrays (FPGAs) or programmable logic arrays (PLAs). In some embodiments, the "processor" can also be embodied in a microprocessor with associated program memory. Furthermore, in some embodiments the "processor" can be embodied in a discrete electronic circuit, which can be an analog circuit, a digital circuit or a combination of an analog circuit and a digital circuit. The "controller" described herein may be provided as a "processor."

As used herein, the term "motion" is used to describe a variety of types of movement associated with an object, for example, including rotational movement (or "rotation") and linear (or "rectilinear") movement of the object. A "motion detector" may, for example, detect rotation of an object. A "rotation detector" is a particular type of "motion detector."

Additionally, while parallel magnetoresistance elements including a certain number of magnetoresistance elements (e.g., two or three) coupled in parallel are described in several examples below, it should be appreciated that the concepts, systems, circuits and techniques disclosed herein may be implemented using more than or less than the certain number of magnetoresistance elements coupled in parallel.

Further, it should be appreciated that, as used herein, relational terms, such as "first," "second," "top," "bottom," "left," "right," and the like, may be used to distinguish one element or portion(s) of an element from another element or portion(s) of the element without necessarily requiring or implying any physical or logical relationship or order between such elements.

Referring now to FIG. 1, an example magnetic field sensor system 100 includes a magnetic field sensor 130 having a plurality of magnetic field sensing elements 140 coupled in parallel and configured to provide an output signal 170a in response to an applied magnetic field (e.g., a magnetic field as may be generated by an object 120, as will be discussed).

The magnetic field sensor 130, which may be provided in the form of an integrated circuit (IC) in some embodiments, includes a signal path, or channel 150 (e.g., an analog, digital or mixed signal path). The sensor 130 also includes a memory device 160 (e.g., EEPROM or flash memory), and a controller 170. The signal path 150 has an input coupled to an output of the parallel magnetic field sensing elements 140, and an output coupled to the controller 170.

The parallel magnetic field sensing elements 140 may be driven by one or more current and/or voltage sources (not shown) and include a plurality of magnetoresistance (MR) elements (e.g., GMR elements) coupled in parallel to form a parallel MR resistance. The parallel magnetic field sensing elements 140 may also include at least one other type of magnetic field sensing element (e.g., Hall effect element) in addition to the magnetoresistance elements in some embodiments. The other type of magnetic field sensing element may be coupled in series or in parallel with the with parallel magnetoresistance elements 140. Further, the specific type of other magnetic field sensing element (e.g., vertical Hall effect element) may be selected such that the other magnetic field sensing element has a same or similar axis of sensitivity as parallel magnetoresistance elements 140.

The applied magnetic field may be generated in various ways depending on the type of sensor system 100 and its application. For example, the applied magnetic field may be generated in response to motion of an object 120 (e.g., a ring magnet or ferromagnetic gear) having features, e.g., magnetic domains or gear teeth 120a, 120b, 120c, 120d. For example, the object 120 can be disposed a shaft 110 (e.g., a steering shaft or a camshaft) configured to rotate in a direction 112. The object 120 may also be coupled to an automobile wheel, as another example. The applied magnetic field may also be generated by a magnet (not shown) disposed proximate to or within the sensor 130. With such a back-biased magnet configuration, motion of the object 120 can result in variations of the magnetic field sensed by the parallel magnetoresistance elements 140 and, thus, may result in variations of the magnetic field signal 140a. It should be appreciated that the parallel magnetoresistance elements 140 may take any form and configuration suitable for detecting motion (e.g., speed of motion and/or direction of motion) of the object 120 by sensing a magnetic field affected by such motion.

Each of the parallel magnetoresistance elements 140 has at least one characteristic (e.g., length, width and/or construction, as will be discussed further below) selected to provide a respective, different response (e.g., change in resistance) to the applied magnetic field. The respective, different responses of the parallel magnetoresistance elements 140 to the applied magnetic field may, for example, differ in linearity, and correspond to at least one of the parallel magnetoresistance elements 140 experiencing a different, non-linear response to the applied magnetic field and/or a magnetic domain. In other words, each of the parallel magnetoresistance elements 140 may have a different susceptibility to response variations, such as may be due to the applied magnetic field and/or a magnetic domain. The foregoing may, for example, reduce the impact of magnetic domains associated with individual magnetoresistance elements of the parallel magnetoresistance elements 140. As known, due to manufacturing constraints and tolerances magnetic domains and responses to a particular magnetic field strength can differ even amongst magnetoresistance elements intended to be identical.

In some embodiments, the parallel magnetoresistance elements 140 may include one or more of a giant magnetoresistance (GMR) element, a magnetic tunnel junction (MTJ) element and a tunneling magnetoresistance (TMR) element. Additionally, in some embodiments, the parallel magnetoresistance elements 140 may include an anisotropic magnetoresistance (AMR) element. In one embodiment, it is preferable for the parallel magnetoresistance elements 140 to be of a same or similar element type (e.g., GMR elements) with each of the parallel magnetoresistance elements 140 having the at least one characteristic selected to provide the respective, different response to the applied magnetic field.

The signal path 150, which includes an amplifier 152, a filter 154 and an analog-to-digital converter (ADC) 156 in the illustrated embodiment, is coupled to receive the magnetic field signal 140a at an input and configured to generate a signal (e.g., digital signal 156a) representative of the magnetic field signal 140a at an output. In particular, the amplifier 152 is coupled to receive the magnetic field signal 140a and configured to generate an amplified signal 152a. Additionally, the filter 154 (e.g., a programmable analog filter) is coupled to receive the amplified signal 152a and configured to generate a filtered signal 154a. Further, the ADC 156 is coupled to receive the filtered signal 154a and configured to generate a corresponding digital signal 156a. The digital signal 156a is provided to a corresponding input of controller 170.

The controller 170 (e.g., a synchronous digital controller or an analog controller), which may include diagnostic circuitry and/or software, for example, is coupled to receive at least the digital signal 156a at a respective input and configured to generate a controller output signal 170a at an output of the sensor 130. The controller output signal 170a can be provided in a variety of signal formats, including, but not limited to, a SENT format, an I²C format, a PWM format, or a two-state binary format, and may be provided as a signal indicative of the magnetic field signal 140a (i.e., a signal indicative of the applied magnetic field). The controller output signal 170a may also be provided as a signal indicative of one or more of a strength of the applied magnetic field, a proximity of a target, an angle of the applied magnetic field, a current associated with the applied magnetic field, and a movement characteristic, such as speed and/or direction, of a ferromagnetic element (e.g., object 120) that affects the applied magnetic field. In some embodiments, the controller output signal 170a may be received by circuitry (e.g., analog, digital or mixed-signal circuitry) (not shown) for further processing (e.g., for generating filtered signals, amplified signals, and the like) and error reporting (e.g., to an engine control unit or ECU). For example, in the context of a magnetic field sensor that provides a speed indicating output signal 170a, the controller 170 may include a peak detector that compares a digital version 156a of the magnetic field sensor signal 140a to a threshold signal. It will be appreciated that other processing circuitry can be provided in the controller 170 according to the desired information to be provided in the output signal 170a.

While the sensor 130 may be provided in the form of an integrated circuit with an analog front end portion and a digital portion, it will be appreciated that the particular delineation of which circuit functions are implemented in an analog fashion or with digital circuitry and signals can be varied. For example, one or more portions of the signal path 150 (e.g., amplifier 152, filter 154, ADC 156) may be provided as part of the controller 170. The controller 170 can, for example, perform the function, operation, or sequence of operations of one or more portions of the signal path 150. Additionally, the memory device 160 can be provided as part of the controller 170 (e.g., as onboard EEPROM). Further, some of the illustrated circuit functions can be implemented on separate circuits (e.g., additional substrates within the same integrated circuit package, or additional integrated circuit packages, and/or on circuit boards).

Figure 2:
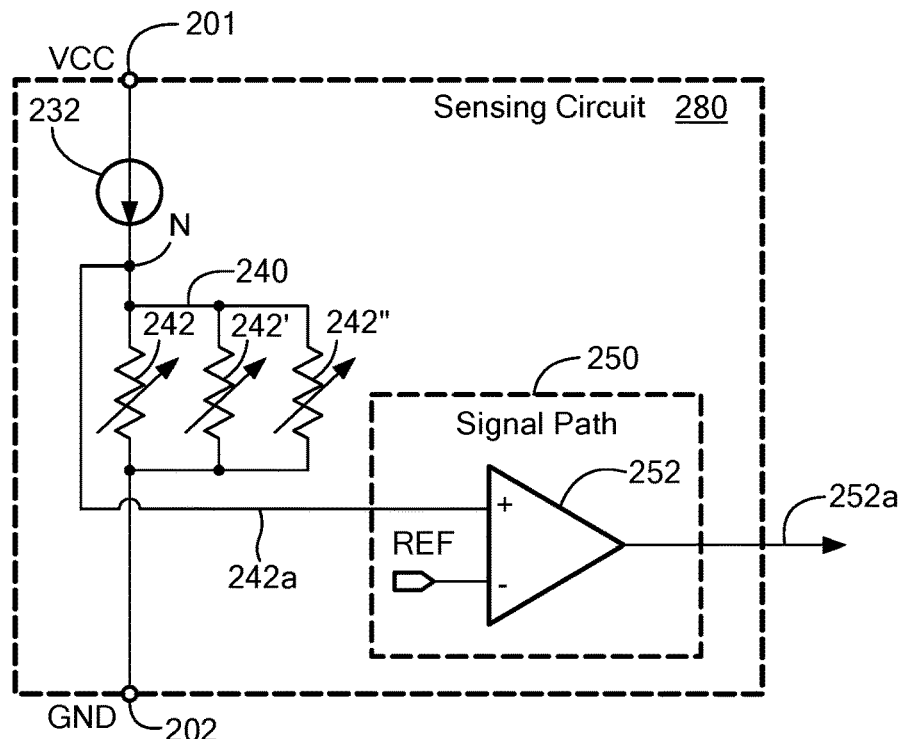
FIG. 2 shows a first example configuration of a sensing circuit that may form a portion of the magnetic field sensor of FIG. 1.
Figure 2A:
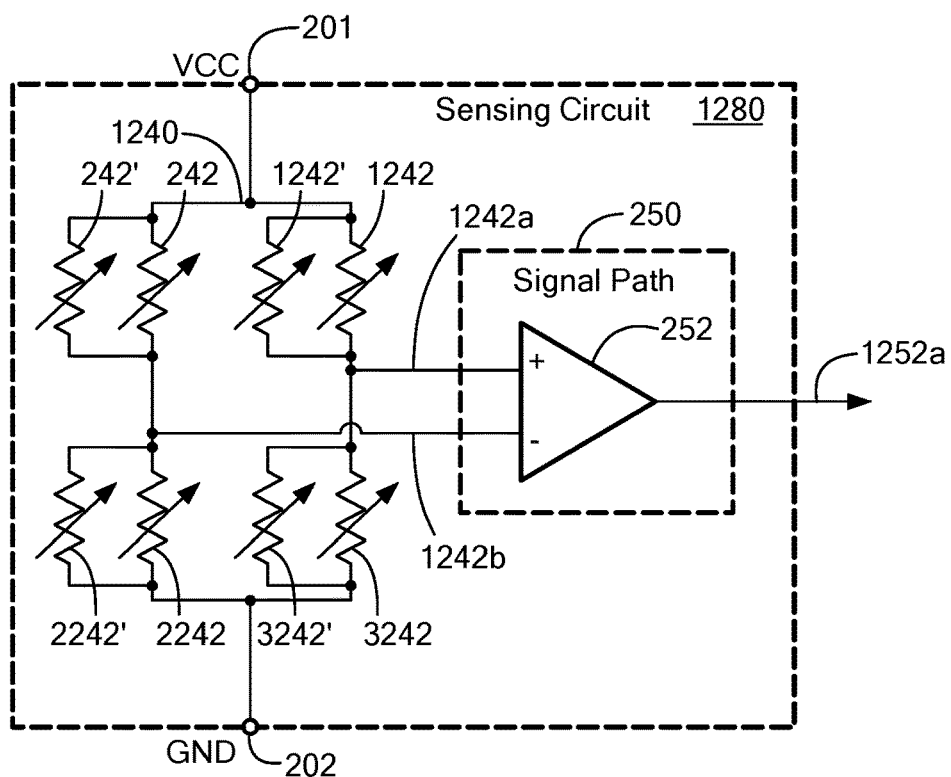
FIG. 2A shows a second example configuration of a sensing circuit that may form a portion of the magnetic field sensor of FIG. 1.
Figure 2B:
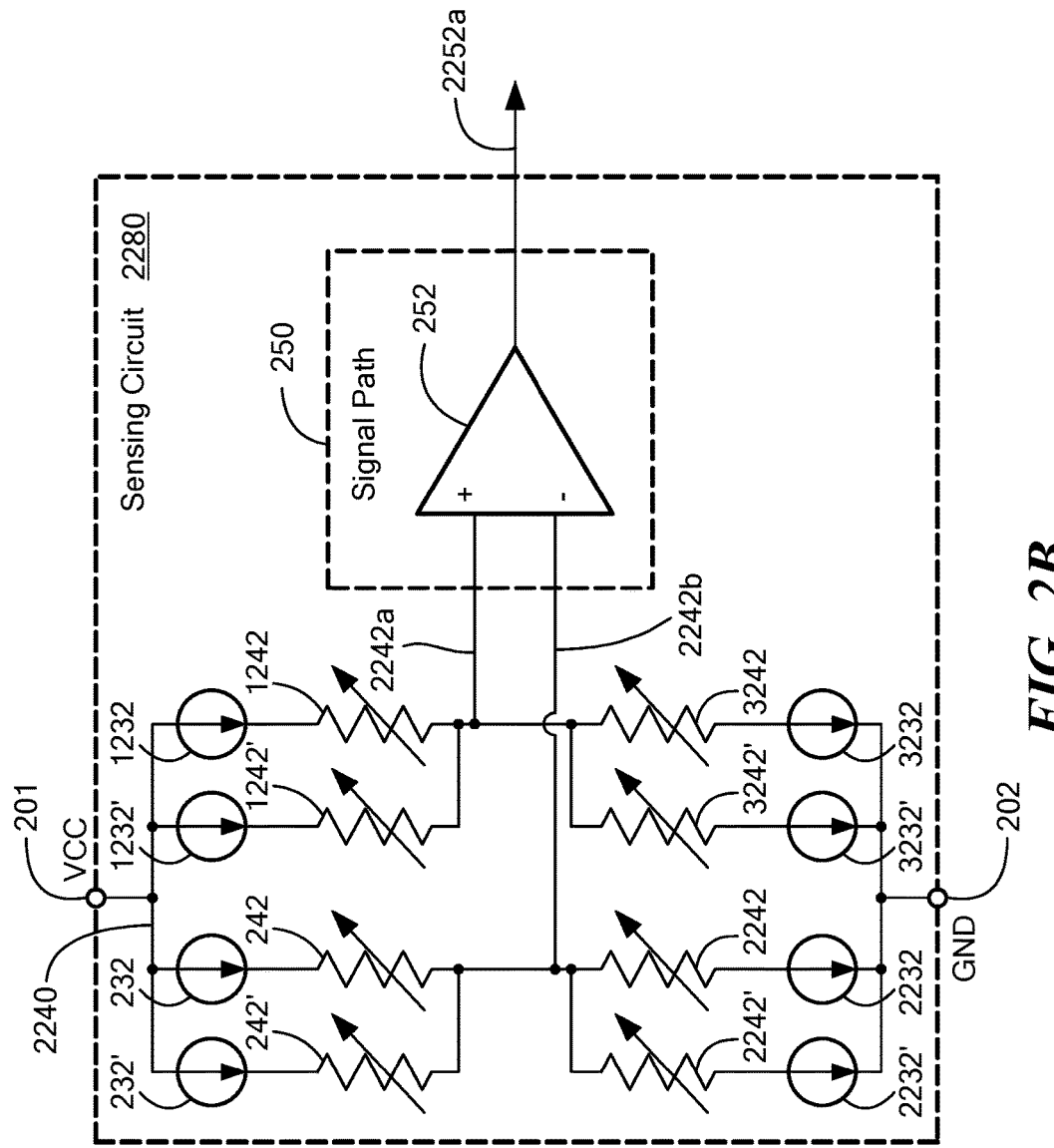
FIG. 2B shows a third example configuration of a sensing circuit that may form a portion of the magnetic field sensor of FIG. 1.

Referring to FIGS. 2-2B, example sensing circuits as may be provided in a magnetic field sensor, such as the sensor 130 of FIG. 1 are shown. It should be appreciated that the example sensing circuits described below are but several of many potential configurations of sensing circuits in accordance with the concepts, systems, circuits and techniques described herein.

Referring to FIG. 2, an example sensing circuit 280 includes a plurality of magnetoresistance elements 242, 242', 242" (e.g., GMR elements), a signal path 250, and a current source 232. The magnetoresistance elements 242, 242', 242", which may be the same as or similar to the parallel magnetoresistance elements 140 of FIG. 1, are coupled in parallel and are referenced collectively by numeral 240. The parallel magnetoresistance elements 240 have a first terminal coupled to the current source 232 and a second terminal coupled to a second terminal 202 of the sensing circuit 280. Current source 232 (e.g., a constant or variable current source) is disposed in a signal path between a first terminal 201 of the sensing circuit 280 and the first terminal of the parallel magnetoresistance elements 240. Additionally, the signal path 250 has an input coupled to a node N between the first and second terminals 201, 202 of the sensing circuit 280, and an output coupled to an output of the sensing circuit 280. The signal path 250 is shown with dotted lines to illustrate that in some embodiments, the signal path 250 can be external to the sensing circuit 280.

The parallel magnetoresistance elements 240, which may be used, for example, to provide an output signal of a magnetic field sensor (e.g., 130, shown in FIG. 1) in response to an applied magnetic field (e.g., a magnetic field as may be generated by object 120 of FIG. 1), are driven by the current source 232. The current source 232 is coupled to a supply voltage, denoted as VCC at the first terminal 201 of the sensing circuit 280, as may be received from a power supply (not shown), and is configured to drive the parallel magnetoresistance elements 240 with a corresponding current.

Each of the parallel magnetoresistance elements 240 has at least one characteristic (e.g., length, width and/or construction) selected to provide a respective, different response (e.g., change in resistance) to an applied magnetic field. The respective, different response of the parallel magnetoresistance elements 240 to the applied magnetic field may, for example, differ in linearity. In one embodiment, each of the parallel magnetoresistance elements 240 has a substantially similar resistance when the applied magnetic field has a magnetic field strength of about zero Gauss. Additionally, in one embodiment, at least one of the parallel magnetoresistance elements 240 experiences a non-linear response to the applied magnetic field. Further, in one embodiment, at least two of the parallel magnetoresistance elements 240 experience a non-linear response in response to the applied magnetic field. The non-linear response may, for example, be a result of a magnetic domain. In other words, each of the parallel magnetoresistance elements 240 may experience a respective, different response (e.g., have a different immunity) to the magnetic domain. The non-linear response may also be a result of the applied magnetic field having a strength greater than a predetermined level. In other words, each of the parallel magnetoresistance elements 240 may experience a respective, different response to the applied magnetic field having a strength greater than the predetermined level. The predetermined level may, for example, be based on type of the parallel magnetoresistance elements 240 (e.g., GMR or AMR elements).

Beyond having the at least one characteristic selected to provide the respective, different response to the applied magnetic field, the parallel magnetoresistance elements 240 may be the same as or similar to each other (e.g., in dimensions and/or construction) or may be different from each other. However, each of the parallel magnetoresistance elements 240 will have at least one characteristic selected to be different to provide the respective, different response to the applied magnetic field.

Changes in the applied magnetic field experienced by the parallel magnetoresistance elements 240 may cause the resistance (e.g., total resistance or parallel MR resistance) of the parallel magnetoresistance elements 240 to change. Additionally, in some embodiments, changes in temperature experienced by the parallel magnetoresistance elements 240 may also cause the resistance of the parallel magnetoresistance elements 240 to change. As the resistance of the parallel magnetoresistance elements 240 changes, a voltage at node N (i.e., 242a) also changes. Additionally, as the resistance of the parallel magnetoresistance elements 240 changes, an output of the sensing circuit 280 (e.g., amplifier output signal 252a) and an output of a sensor (e.g., 130) in which the sensing circuit 280 may be provided may also change.

Since magnetoresistance elements 242, 242', 242" are coupled in parallel in the example embodiment shown, the total resistance (i.e., $R_{total}$) or parallel MR resistance of the parallel magnetoresistance elements 240 is equal to $R_{242} \| R_{242'} \| R_{242''}$, or $$\frac{R_{242} \times R_{242'} \times R_{242''}}{(R_{242} \times R_{242'}) + (R_{242} \times R_{242''}) + (R_{242'} \times R_{242''})},$$

where $R_{242}$ corresponds to a resistance associated with magnetoresistance element 242, $R_{242'}$ corresponds to a resistance associated with magnetoresistance element 242', and $R_{242''}$ corresponds to a resistance associated with magnetoresistance element 242". As one example result of this arrangement, in embodiments where one or more of the parallel magnetoresistance elements 240 (e.g., magnetoresistance element 242) experiences a non-linear response to the applied magnetic field (e.g., due to a magnetic domain or the applied magnetic field having a strength greater than a predetermined level), the total resistance of the parallel magnetoresistance elements 240 is minimally affected by the non-linear response of the one or more parallel magnetoresistance elements 240 to the applied magnetic field. It follows that the voltage at node N (i.e., 242a), the output of the sensing circuit 280, and the output of the sensor in which the sensing circuit 280 may be provided, likewise may be minimally affected by the non-linear response of the one or more parallel magnetoresistance elements 240 to the applied magnetic field. Detection accuracy of the sensing circuit 280 can thereby be improved over conventional arrangements.

In other words, in contrast to conventional arrangements in which only a single magnetoresistance element is used, which single element may experience a non-linear response to an applied magnetic field, the parallel magnetoresistance elements 240 in the above-described arrangement may experience a reduced change in total resistance (e.g., a reduced impact from a magnetic domain) as a result of the parallel coupling of magnetoresistance elements 242, 242', 242" that have at least one characteristic (e.g., length, width and/or construction) selected to provide a respective, different response to the applied magnetic field.

For example, if magnetoresistance element 242 of the parallel magnetoresistance elements 240 in the above-described arrangement experiences a non-linear response to an applied magnetic field due to a magnetic domain, the total resistance of the parallel magnetoresistance elements 240 may be given by $(R_{242}+R_{domain}) \| R_{242'} \| R_{242''}$, or $$\frac{(R_{242} + R_{domain}) \times R_{242'} \times R_{242''}}{((R_{242} + R_{domain}) \times R_{242'}) + ((R_{242} + R_{domain}) \times R_{242''}) + (R_{242'} \times R_{242''})},$$

where $R_{domain}$ corresponds to the resistance change due to the magnetic domain. As illustrated, magnetoresistance elements 242' and 242" mask (or minimize) the impact of the magnetic domain on the total resistance of the parallel elements. In contrast, if only the magnetoresistance element 242 were used, the resulting resistance would be given by $R_{242}+R_{domain}$.

The signal path 250, which may be the same as or similar to signal path 150 described above in conjunction with FIG. 1, for example, is configured to provide an output signal (e.g., amplifier output signal 252a) of the sensing circuit 280. The signal path 250 includes an amplifier 252 which may be the same as or similar to amplifier 152 of signal path 150 and may be powered by the supply voltage received at first terminal 201 of the sensing circuit 280 and coupled to receive a voltage 242a associated with magnetoresistance elements 240 at a first amplifier input (e.g., a non-inverting input). The amplifier 252 is also coupled to receive a reference signal (e.g., a ground or non-zero reference voltage) at a second amplifier input (e.g., an inverting input) and configured to generate an amplifier output signal 252a indicative of a voltage difference between the voltage 242a and the reference signal. The amplifier output signal 252*a* corresponds to an output signal of the sensing circuit 280 in the illustrated embodiment.

In some embodiments, the output of sensing circuit 280 (here, amplifier output signal 252*a*) may be received at an input of circuitry (e.g., controller 170) for further processing (e.g., to provide an output of a sensor IC). Additionally, in some embodiments, signal path 250 includes circuitry (e.g., proximity detector circuitry) to determine the speed, direction, proximity, angle, etc. of an object (e.g., 120, shown in FIG. 1) based on changes in the applied magnetic field, and responses of the parallel magnetoresistance elements 240 to the applied magnetic field.

Referring to FIG. 2A, a sensing circuit 1280 in accordance with another embodiment includes magnetoresistance elements 242, 242' and signal path 250. The sensing circuit 1280 also includes additional magnetoresistance elements 1242, 1242', 2242, 2242', 3242, 3242' in the illustrated embodiment. Magnetoresistance elements 242, 242', 1242, 1242', 2242, 2242', 3242, 3242' are coupled in a bridge configuration (e.g., a Wheatstone bridge configuration), as denoted by reference numeral 1240. The bridge configuration 1240 has a first terminal coupled to first terminal 201 of sensing circuit 1280 and a second terminal coupled to second terminal 202 of sensing circuit 1280.

Each of the magnetoresistance elements of FIG. 2A is coupled in parallel with at least one other magnetoresistance element. In particular, magnetoresistance element 242' is coupled in parallel with magnetoresistance element 242, magnetoresistance element 1242' is coupled in parallel with magnetoresistance element 1242, magnetoresistance element 2242' is coupled in parallel with magnetoresistance element 2242, and magnetoresistance element 3242' is coupled in parallel with magnetoresistance element 3242. In some embodiments, more than two magnetoresistance elements may be coupled in parallel with each other, as shown in FIG. 2, for example. Each "arm" of the bridge configuration 1240 contains a same number of magnetoresistance elements (e.g., two) coupled in parallel, as shown in FIG. 2A, for example. However, in other embodiments, it is possible for at least one "arm" of the bridge configuration 1240 to contain a different number of magnetoresistance elements coupled in parallel than other "arms" of the bridge configuration 1240.

The parallel magnetoresistance elements of FIG. 2A each have at least one characteristic (e.g., length, width and/or construction) selected to provide a respective, different response (e.g., change in resistance) to an applied magnetic field in some embodiments. The foregoing may, for example, provide for each of the magnetoresistance elements of FIG. 2A having a different immunity to a magnetic domain, as discussed above in conjunction with FIG. 2. In other embodiments, each magnetoresistance element in a parallel-coupled pair or group of magnetoresistance elements (e.g., 242, 242') has at least one characteristic selected to provide a respective, different response to the applied magnetic field, but magnetoresistance elements in different parallel-coupled groups of magnetoresistance elements may have the same or similar response. For example, magnetoresistance elements 242, 1242, which are not coupled in parallel in the illustrated embodiment, may have a same or similar response to the applied magnetic field in some embodiments. The foregoing may provide for each of the magnetoresistance elements of FIG. 2A (e.g., 242, 242', 1242) in a parallel-coupled pair or group of magnetoresistance elements having a different immunity to a magnetic domain. In one embodiment, it is preferable for each parallel-coupled pair or group of magnetoresistance elements to have a same or similar immunity response to the applied magnetic field (e.g., such that a probability of occurrence of a magnetic domain condition with one or more of the magnetoresistance elements is normalized).

Amplifier 252 of signal path 250 is coupled to receive a first output voltage 1242*a* generated at a first voltage node of the bridge configuration 1240 at a first amplifier input (e.g., non-inverting input), a second output voltage 1242*b* generated at a second voltage node of the bridge configuration 1240 at a second amplifier input (e.g., an inverting input), and configured to generate an amplifier output signal 1252*a* indicative of a voltage difference between the first output voltage 1242*a* and the second output voltage 1242*b*. Amplifier output signal 1252*a* may correspond to an output signal of the sensing circuit 1280.

As the resistance of the magnetoresistance elements in bridge configuration 1240 changes in response to an applied magnetic field as may be produced by motion of an object (e.g., 120, shown in FIG. 1), for example, at least one of the first output voltage 1242*a* and the second output voltage 1242*b* may also change. The changes in the first output voltage 1242*a* and/or the second output voltage 1242*b* may be used to detect changes in the applied magnetic field. Since each of the magnetoresistance elements in at least a parallel-coupled pair or group of magnetoresistance elements has at least one characteristic selected to provide a respective, different response to the applied magnetic field, detection accuracy of the applied magnetic field may be minimally affected by an unexpected or undesirable (e.g., non-linear) response of one or more of the magnetoresistance elements to the applied magnetic field.

While the magnetoresistance elements of FIG. 2A (e.g., 242, 242', 1242) are shown coupled in a bridge configuration 1240 in the example embodiment shown, other arrangements are possible, for example, a resistor divider arrangement. Other possible arrangements include an arrangement in which the magnetoresistance elements are used as load resistors in an amplifier stage, a half-bridge circuit comprising the magnetoresistance elements, and a circuit including at least one parallel-coupled pair or group of magnetoresistance elements which are coupled to a current source. Many other arrangements are, of course, possible, as will be apparent to one of skill in the art.

Referring to FIG. 2B, in which like elements of FIGS. 2 and 2A are provided having like reference designations, a sensing circuit 2280 in accordance with another embodiment includes magnetoresistance elements 242, 242', 1242, 1242', 2242, 2242', 3242, 3242' and signal path 250. The sensing circuit 2280 also includes current sources 232, 232', 1232, 1232', 2232, 2232', 3232, 3232' in the illustrated embodiment. Current sources 232, 232', 1232, 1232', 2232, 2232', 3232, 3232', which may be the same as or similar to each other in some embodiments, are each coupled to one or more of the magnetoresistance elements 242, 242', 1242, 1242', 2242, 2242', 3242, 3242' and in a bridge configuration (e.g., a Wheatstone bridge configuration), as denoted by reference numeral 2240.

The current sources of FIG. 2B are each coupled to receive the supply voltage, denoted as VCC, at the first terminal 201 of the sensing circuit 2280, and are configured to drive the magnetoresistance elements with corresponding current signals. The magnitude of these current signals may, for example, be adjusted to bias one or more of the magnetoresistance elements to provide for improved accuracy in the sensing circuit 2280 (e.g., by providing temperature compensation in the sensing circuit 2280). As one example, temperature compensation may be provided in sensing circuit 2280 by adjusting the magnitude of the current signals to maintain a same or similar voltage level at one or more voltage nodes in the sensing circuit 2280 (e.g., a first voltage node, as will be discussed) regardless of temperature. Although the current sources of FIG. 2B (e.g., 232) are each shown as coupled to a single magnetoresistance element (e.g., 242) in the illustrated embodiment, it should be appreciated that in other embodiments one or more of the current sources of FIG. 2B may be coupled to two or more magnetoresistance elements.

Amplifier 252 of signal path 250 is coupled to receive a first output voltage 2242a generated at a first voltage node of the bridge configuration 2240 at a first amplifier input (e.g., non-inverting input), a second output voltage 2242b generated at a second voltage node of the bridge configuration 2240 at a second amplifier input (e.g., inverting input), and is configured to generate an amplifier output signal 2252a indicative of a voltage difference between the first output voltage and the second output voltage. Amplifier output signal 2252a corresponds to an output signal of the sensing circuit 2280 in the illustrated embodiment.

While the sensing circuits of FIGS. 2-2B are shown as including a certain number of magnetoresistance elements with the magnetoresistance elements positioned in a particular manner, it should be appreciated that other configurations of magnetoresistance elements are possible in accordance with the concepts, systems, circuits and techniques sought to be protected herein. The circuits may be implemented using more than or less than the number of magnetoresistance elements shown, and the magnetoresistance elements may be configured in other manners than that which is shown.

Figure 3:
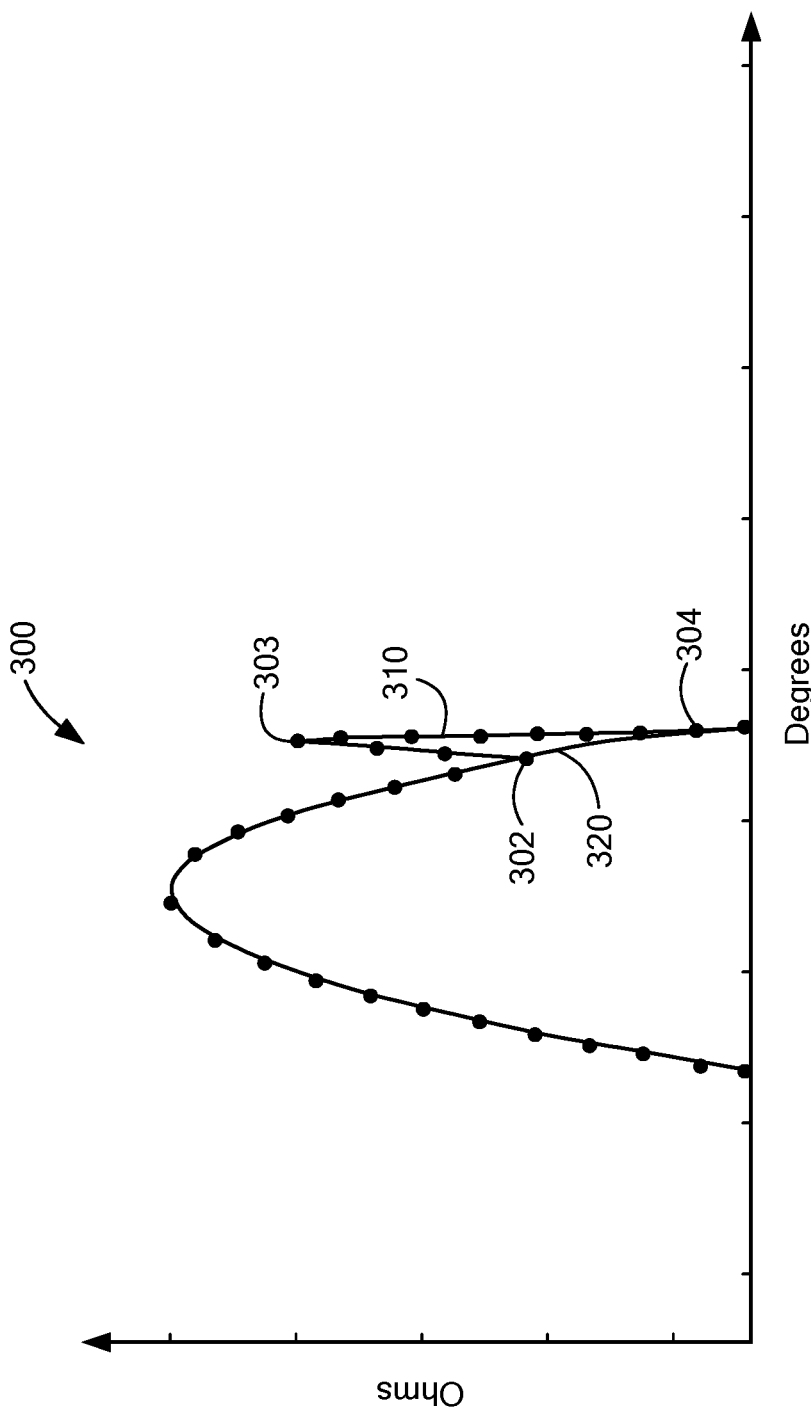
FIG. 3 shows an illustrative characteristic curve associated with a single magnetoresistance element and an illustrative characteristic curve associated with an example configuration comprising a plurality of magnetoresistance elements according to the disclosure.

Referring to FIG. 3, illustrative characteristic curves as may be representative of response characteristics of magnetoresistance elements, which can be the same as or similar to the magnetoresistance elements described above in conjunction with FIGS. 1-2B, for example, are shown in a plot 300. The magnetoresistance elements can be provided, for example, in a magnetic field sensor which can be the same as or similar to magnetic field sensor 130 of FIG. 1. Plot 300 has a horizontal axis with a scale in degrees corresponding, for example, to rotation of an object (e.g., object 120, shown in FIG. 1) with respect to the magnetoresistance elements, and a vertical axis with a scale in ohms corresponding to resistance of the magnetoresistance elements.

Plot 300 includes a first characteristic curve 310 representative of a response characteristic of a single magnetoresistance element (e.g., 242), and a second characteristic curve 320 representative of a combined response characteristic of a plurality of magnetoresistance elements (e.g., 242, 242', 242") coupled in parallel (e.g., 240), for example, as shown in FIGS. 2-2B, when subjected to a magnetic field (e.g., an applied magnetic field).

Curve 310 is represented by a line with markings (e.g., circle markings) and overlaps curve 320, which is represented by a line without markings, for a substantial portion of the plot 300, as will be discussed below. Each of the parallel-coupled magnetoresistance elements characterized by curve 320 has at least one characteristic (e.g., length, width and/or construction) selected to provide a respective, different response to an applied magnetic field. The plurality of magnetoresistance elements characterized by curve 320 may include the magnetoresistance element characterized by curve 310.

As illustrated, the resistance of the magnetoresistance element characterized by curve 310 and the resistance (e.g., total resistance) of the parallel magnetoresistance elements characterized by curve 320 generally change in response to changes in a magnetic field strength experienced by the magnetoresistance element(s), except for when the magnetoresistance element(s) is/are in a so-called saturation region in which the resistance of the magnetoresistance element(s) substantially levels off.

As is also illustrated, the curves 310 and 320 are substantially the same (and the magnetoresistance element(s) characterized by the curves 310 and 320 have substantially the same resistance) until the magnetoresistance element(s) experience a first magnetic field strength, for example, at a first rotation position of the object, as represented by point 302. At point 302, the magnetoresistance element characterized by curve 310 experiences a sudden increase in resistance, while the combined resistances of parallel-coupled magnetoresistance elements characterized by curve 320 continue to decrease. In the example embodiment shown, the magnetoresistance element characterized by curve 310 experiences an increase in resistance from the first magnetic field strength at point 302 until a second, different magnetic field strength, for example, at a second rotation position of the object, as represented by point 303. At point 303, the magnetoresistance element characterized by curve 310 experiences a sudden decrease in resistance. Additionally, at point 304, which corresponds to a third, different magnetic field strength, for example, experienced by the magnetoresistance element(s) at a third rotation position of the object, curves 310 and 320 meet again, with the magnetoresistance element(s) characterized by curves 310 and 320 having a substantially similar resistance at the third magnetic field strength.

The sudden resistance changes illustrated by curve 310 relative to curve 320 between points 302 and 304 may, for example, correspond to the magnetoresistance element characterized by curve 310 experiencing a substantial non-linear response to the applied magnetic field (e.g., due to a magnetic domain or the applied magnetic field having a strength greater than a predetermined level), while the combined resistance of the parallel-coupled magnetoresistance elements characterized by curve 320, which may include the magnetoresistance element characterized by curve 310, is substantially immune to the adverse response characteristic of one of its constituent parallel-coupled elements. For example, parallel magnetoresistance elements characterized by curve 320 may experience a slightly non-linear response or may even remain substantially linear due to the parallel coupling of its magnetoresistance elements. The foregoing may provide for improved detection accuracy by the parallel magnetoresistance elements and, more importantly, detection accuracy of a magnetic field sensor in which the parallel magnetoresistance elements may be provided.

Figures 4, 4A:
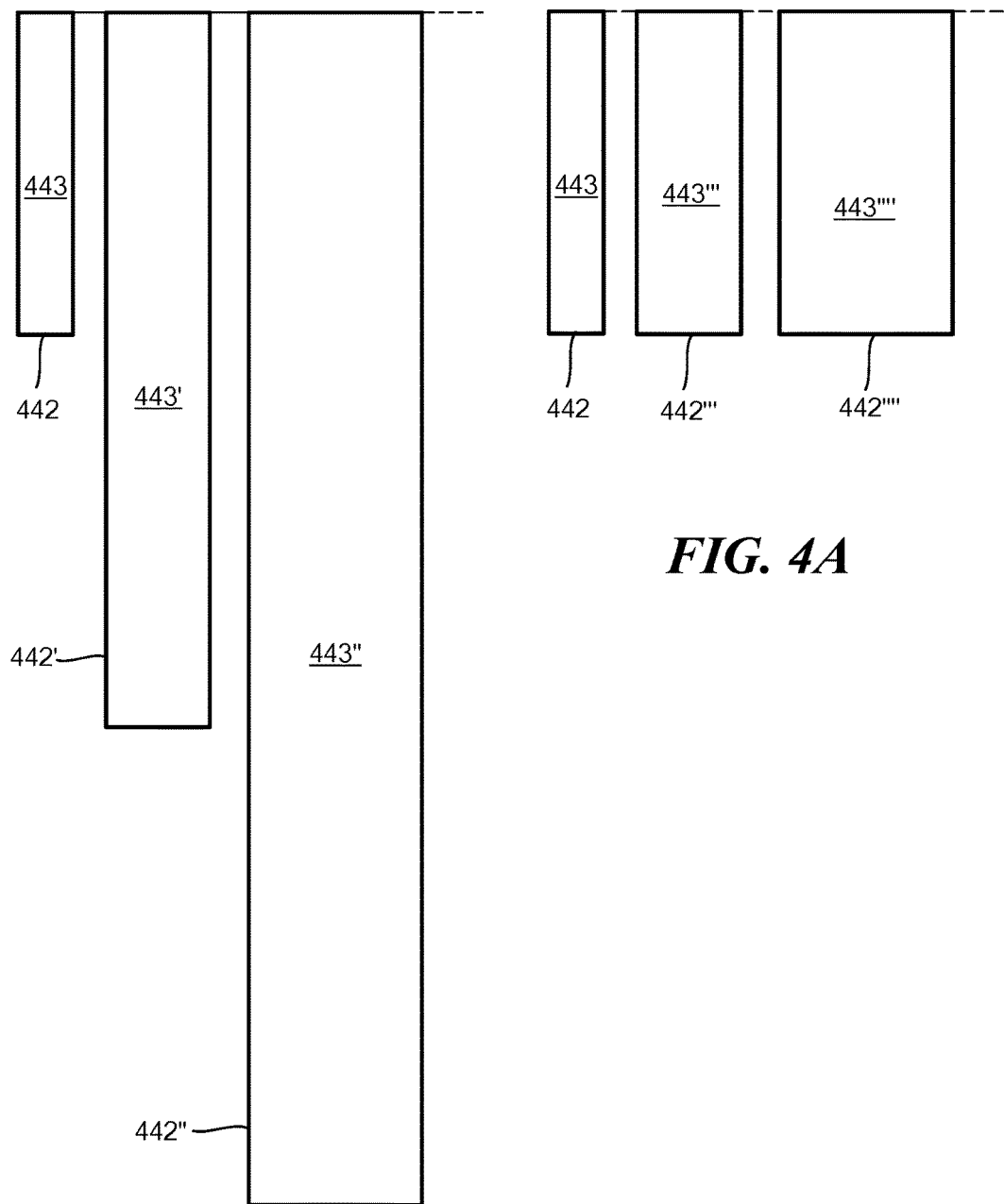
FIG. 4 shows an example configuration of magnetoresistance elements as may be provided in the magnetic field sensor of FIG. 1.
FIG. 4A is a block diagram of an example integrated circuit for detecting motion of an object, the integrated circuit including the monitor circuit of FIG. 2.

Referring to FIG. 4, an example plurality of magnetoresistance elements 442, 442', 442" as may be coupled in parallel and provided in a magnetic field sensor (FIG. 1) is shown. Magnetoresistance elements 442, 442', 442" (e.g., GMR yokes or yoke structures), which may be the same as or similar to magnetoresistance elements 242, 242', 242" of FIG. 2, are coupled in parallel and supported by a substrate (not shown). The substrate may be a semiconductor substrate or any other material substrate that can support electrical components and may be provided in the form of an integrated circuit. It is also possible that the parallel-coupled magnetoresistance elements may be provided on separate electrically coupled substrates within the same integrated circuit package. Similar to the magnetoresistance elements described above, each of the magnetoresistance elements has at least one characteristic (e.g., dimensions and/or construction) selected to provide a respective, different response to an applied magnetic field.

In the example embodiment shown, each of the magnetoresistance elements 442, 442', 442" has a respective length and width. Additionally, each of the magnetoresistance elements 442, 442', 442" has a first major surface (e.g., 443, 443', 443") and a second opposing major surface (not shown). The second major surface may be parallel, or parallel within manufacturing tolerances, to the respective first major surface. A first dimension across first major surface 443 (e.g., a major axis of the first major surface 443) of a first one of the magnetoresistance elements 442 may correspond to a length of the first magnetoresistance element 442 and a second dimension across the first major surface 443 (e.g., a minor axis of the first major surface 443) may correspond to a width of the first magnetoresistance element 442. Additionally, a first dimension across a first major surface 443' of a second one of the magnetoresistance elements 442' may correspond to a length of the second magnetoresistance element 442' and a second dimension across the first major surface 443' may correspond to a width of the second magnetoresistance element 442'. Further, a first dimension across a first major surface 443" of a third one of the magnetoresistance elements 442" may correspond to a length of the third magnetoresistance element 442" and a second dimension across the first major surface 443" may correspond to a width of the third magnetoresistance element 442".

The above-described length and width dimensions of the magnetoresistance elements 442, 442', 442" may comprise the at least one characteristic selected to provide the respective, different responses (e.g., corresponding changes in resistance) to the applied magnetic field in some embodiments. As one example, the length and width of first magnetoresistance element 442 may be a multiple of the length and width of second magnetoresistance element 442'. Additionally, the length and width of second magnetoresistance element 442' may be a multiple of the length and width of third magnetoresistance element 442". For example, the length and width of first magnetoresistance element 442 may be approximately one-half the length and width of second magnetoresistance element 442'. Additionally, the length and width of second magnetoresistance element 442' may be approximately one-half the length and width of third magnetoresistance element 442". Other multiples (e.g., one-third, one-fourth, etc.) of the lengths and widths of the magnetoresistance elements 442, 442', 442" are possible.

In one embodiment, it is preferable for the magnetoresistance elements 442, 442', 442" to each have the characteristic (e.g., length and/or width) selected to be different in order to provide the respective, different response to the applied magnetic field, as in the above example in which each of the magnetoresistance elements 442, 442', 442" has a different length and width than the other magnetoresistance elements. In another embodiment, two of the magnetoresistance elements 442, 442', 442" may have a first characteristic (e.g., length and/or width) selected to be different while one of the magnetoresistance elements may have a second characteristic (e.g., construction) selected to be different. For example, magnetoresistance elements 442, 442' may each have lengths and widths selected to be different than each other, while magnetoresistance element 442" may have a same length and width as one of the magnetoresistance elements 442, 442' but have a construction (e.g., layer stack up) selected to be different.

The respective lengths and widths of the magnetoresistance elements 442, 442', 442" may also be selected such that each magnetoresistance element 442, 442', 442" has at least one different dimension (e.g., length), while also retaining a substantially similar resistance when subjected to substantially no magnetic field (i.e., a magnetic field with a strength of about zero Gauss). For example, each of the magnetoresistance elements 442, 442', 442" may have a same or similar width but have a different length to provide for a substantially similar resistance when subjected to substantially no magnetic field. In this scenario, the length may comprise the at least one characteristic selected to provide the respective, different responses to the applied magnetic field. Alternatively, the width may comprise the at least one characteristic selected to provide the respective, different responses to the applied magnetic field while the lengths of the parallel-coupled elements may be substantially the same. As shown in FIG. 4A, the width of elements 442, 442''', 442"" are each different while the lengths of elements 442, 442''', 442"" are substantially the same. Each of the magnetoresistance elements 442, 442''', 442"" has a first major surface (e.g., 443, 443''', 443"") and a second opposing major surface (not shown). The second major surface may be parallel, or parallel within manufacturing tolerances, to the respective first major surface.

In general, the respective lengths and widths of the magnetoresistance elements 442, 442', 442" may be any lengths and widths that provide for a respective, different response to an applied magnetic field. Additionally, the lengths and widths of the magnetoresistance elements 442, 442', 442" can be made to have any dimensions within manufacturing capabilities to achieve any desired resistance, and provide for the respective, different response to the applied magnetic field.

In some embodiments, one or more parameters associated with the construction of each of the magnetoresistance elements 442, 442', 442" may comprise the at least one characteristic selected to provide the respective, different responses to the applied magnetic field. Illustrative construction parameters include one or more of: a material, a layer thickness, and a ordering of one or more layers (e.g., antiferromagnetic layers, pinned layers and/or non-magnetic layers) of the magnetoresistance elements 442, 442', 442". The respective construction may also include a spatial relationship of the magnetoresistance elements 442, 442', 442" on one plane, for example, relative to an applied magnetic field. For example, magnetoresistance elements 442, 442', 442" may each be supported by a semiconductor substrate with magnetoresistance element 442 positioned closer to an edge of the substrate than magnetoresistance element 442' and magnetoresistance element 442' positioned closer to the edge of the substrate than magnetoresistance element 442".

As one example, magnetoresistance elements 442, 442', 442" may each comprise multiple layers (i.e., a material stack) including one or more antiferromagnetic layers, one or more pinned layers, and/or one or more non-magnetic layers. The antiferromagnetic layers may include Manganese-Platinum (MnPt), the pinned layers may include Cobalt-Iron (CoFe), and the non-magnetic layers may include a select one of Iridium (Ir) and Ruthenium (Ru) as a few examples.

In general, the material, layer thickness, and ordering of the layers (e.g., antiferromagnetic and non-magnetic layers) of the magnetoresistance elements 442, 442', 442" can affect the manner in which the magnetoresistance elements 442, 442', 442" respond to an applied magnetic field.

Figure 5:
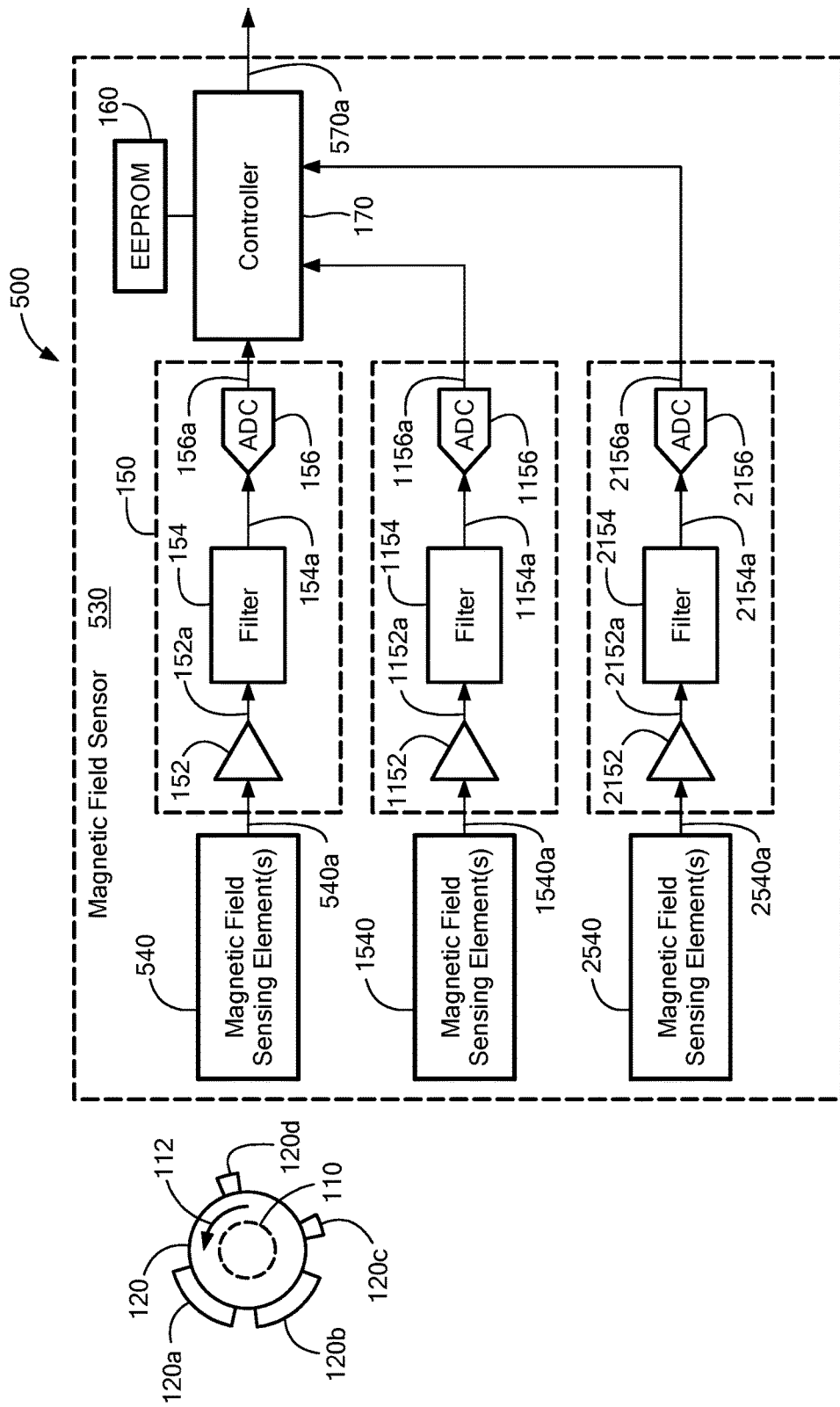
FIG. 5 is a block diagram of another example magnetic field sensor comprising a plurality of magnetoresistance elements according to a further aspect of the disclosure.

Referring to FIG. 5, in which like elements of FIG. 1 are provided having like reference designations, a magnetic field sensor system 500 in accordance with another embodiment includes a magnetic field sensor 530, as may be provided in the form of an integrated circuit (IC). The sensor 530 includes magnetic field sensing element(s) 540, magnetic field sensing element(s) 1540 and magnetic field sensing element(s) 2540, each of which includes at least one magnetoresistance element (e.g., a GMR element). The sensor 530 additionally includes respective signal paths, or channels 150, 1150 and 2150. The signal path 150 has an input coupled to an output of magnetic field sensing element(s) 540 and an output coupled to a corresponding input of a controller 170. Additionally, the signal path 1150 has an input coupled to an output of magnetic field sensing element(s) 1540 and an output coupled to a corresponding input of the controller 170. Further, the signal path 2150 has an input coupled to an output of magnetic field sensing element(s) 2540 and an output coupled to a corresponding input of the controller 170.

Magnetic field sensing element(s) 540, which includes at least one magnetoresistance element (e.g., a GMR element), may be driven by a first current source (not shown) and configured to generate a magnetic field signal (e.g., magnetic field signal 540a) in response to an applied magnetic field (e.g., a magnetic field as may be generated by motion of object 120).

Magnetic field sensing element(s) 540 may also include at least one other type of magnetic field sensing element (e.g., Hall effect element) in addition to the at least one magnetoresistance element 540 in some embodiments. The other type of magnetic field sensing element, which may be sensitive in a same direction or plane as magnetic field sensing element(s) 540, may also be configured to generate a magnetic field signal (e.g., magnetic field signal 540a) in response to the applied magnetic field. The applied magnetic field, as may be sensed by magnetic field sensing element(s) 540, may be similar to the applied magnetic fields discussed in the figures above and generated in various ways depending on the type of sensor 530 and its application. As one example, the applied magnetic field may be generated in response to motion of the object 120.

Signal path 150 is coupled to receive the magnetic field signal 540a at an input and configured to generate a signal (e.g., digital signal 156a) representative of the magnetic field signal 540a at an output. In particular, amplifier 152 of the signal path 150 is coupled to receive the magnetic field signal 540a and configured to generate an amplified signal 152a. Additionally, filter 154 of the signal path 150 is coupled to receive the amplified signal 152a and configured to generate a filtered signal 154a. Further, ADC 156 of the signal path 150 is coupled to receive the filtered signal 154a and configured to generate a corresponding digital signal 156a. The digital signal 156a is provided to a corresponding input of controller 170.

Magnetic field sensing element(s) 1540, 2540 may be the same as or similar to magnetic field sensing element(s) 540 with each including at least one magnetoresistance element. Each of magnetoresistance elements 540, 1540, 2540 has at least one characteristic selected to provide a respective, different response to the applied magnetic field. The at least one selected characteristic for each of elements 540, 1540, 2540 may be the same or different. Additionally, signal paths 1150, 2150 may be the same as or similar to signal path 150, as shown. Signal path 1150 is coupled to receive a magnetic field signal 1540a at an input and configured to generate a signal (e.g., digital signal 1156a) representative of the magnetic field signal 1540a at an output. Additionally, signal path 2150 is coupled to receive a magnetic field signal 2540a at an input and configured to generate a signal (e.g., digital signal 2156a) representative of the magnetic field signal 2540a at an output.

The controller 170 (i.e., processing circuitry) is coupled to receive at least the digital signal 156a, the digital signal 1156a, and the digital signal 2156a at respective inputs and configured to generate a controller output signal 570a at an output of the sensor 530. The controller output signal 570a may be provided as a signal indicative of at least one of the magnetic field signal 540a, the magnetic field signal 1540a, and the magnetic field signal 2540a (i.e., a signal indicative of the applied magnetic field). The controller output signal 570a may also be provided as a signal indicative of one or more of a strength of the applied magnetic field, a proximity of an object, an angle of the applied magnetic field, a current associated with the applied magnetic field, and a movement (e.g., speed and/or direction) of a ferromagnetic element (e.g., object 120) that affects the applied magnetic field. In some embodiments, the controller output signal 570a may be received by circuitry (e.g., analog, digital or mixed-signal circuitry) (not shown) for further processing (e.g., for generating filtered signals, amplified signals, and the like) and error reporting (e.g., to an engine control unit or ECU).

Additionally, in some embodiments, the controller 170 may be configured to evaluate or poll (i.e., sample) each of magnetic field sensing element(s) 540, 1540, 2540 (or outputs of each of magnetic field sensing element(s) 540, 1540, 2540) at predetermined time periods through use of one or more algorithms in the controller 170. As one example, the controller 170 may evaluate the outputs of the magnetic field sensing element(s) 540, 1540, 2540 (i.e., may evaluate signals 156a, 1156a, 2156a) with one or more detectors (e.g., peak detectors). As long as at least two of the outputs of the magnetic field sensing element(s) 540, 1540, 2540 respond in a same or similar manner to the applied magnetic field (e.g., two detector outputs switch at substantially the same time), as may be determined through one or more logic operations (e.g., exclusive-or operation), for example, the controller 170 may provide an output signal (here, controller output signal 570a) indicative of a speed of motion of the object 120 or a direction of motion of the object 120. In other words, as one result of each of the magnetic field sensing element(s) 540, 1540, 2540 having at least one characteristic selected to provide a respective, different response to the applied magnetic field, the output signal 570a of the controller 170 is not affected (or at least is less affected) if one of the magnetic field sensing element(s) 540, 1540, 2540 has an unexpected or undesirable response to the applied magnetic field (e.g., due to a magnetic domain or the applied magnetic field having a strength greater than a predetermined level).

As described above and will be appreciated by those of ordinary skill in the art, embodiments of the disclosure herein may be configured as a system, method, or combination thereof. Accordingly, embodiments of the present disclosure may be comprised of various means including hardware, software, firmware or any combination thereof. Furthermore, embodiments of the present disclosure may take the form of a computer program product on a computer-readable storage medium having computer readable program instructions (e.g., computer software) embodied in the storage medium. Any suitable non-transitory computer-readable storage medium may be utilized.

It is to be appreciated that the concepts, systems, circuits and techniques sought to be protected herein are not limited to use in a particular application but rather, may be useful in substantially any application where it is desired to detect a magnetic field.

Having described preferred embodiments, which serve to illustrate various concepts, structures and techniques, which are the subject of this patent, it will now become apparent to those of ordinary skill in the art that other embodiments incorporating these concepts, structures and techniques may be used. Additionally, elements of different embodiments described herein may be combined to form other embodiments not specifically set forth above.

Accordingly, it is submitted that that scope of the patent should not be limited to the described embodiments but rather should be limited only by the spirit and scope of the following claims.

What is claimed is:

1. A magnetic field sensor comprising a plurality of magnetoresistance elements, each having a respective length and width selected to provide a respective, different response to an applied magnetic field, wherein each of the plurality of magnetoresistance elements is coupled in parallel, wherein a width of a first one of the plurality of magnetoresistance elements is different than and a multiple of a width of a second one of the plurality of magnetoresistance elements, and wherein a length of the first one of the plurality of magnetoresistance elements is the same as a length of the second one of the plurality of magnetoresistance elements.

2. The magnetic field sensor of claim 1, wherein the respective, different responses of the plurality of magnetoresistance elements to the applied magnetic field differ in linearity.

3. The magnetic field sensor of claim 1, wherein each of the plurality of magnetoresistance elements has a substantially similar resistance when the applied magnetic field has a magnetic field strength of about zero Gauss.

4. The magnetic field sensor of claim 1, wherein at least one of the plurality of magnetoresistance elements experiences a non-linear response to the applied magnetic field.

5. The magnetic field sensor of claim 4, wherein at least two of the plurality of magnetoresistance elements experience a non-linear response to the applied magnetic field.

6. The magnetic field sensor of claim 4, wherein the non-linear response is a result of a magnetic domain.

7. The magnetic field sensor of claim 4, wherein the non-linear response is a result of the applied magnetic field having a strength greater than a predetermined level.

8. The magnetic field sensor of claim 1, wherein the width of the first one of the plurality of magnetoresistance elements is approximately one-half the width of a second one of the plurality of magnetoresistance elements.

9. The magnetic field sensor of claim 1, wherein each of the plurality of magnetoresistance elements has a respective construction and wherein the respective construction comprises the at least one characteristic selected to provide the respective, different responses to the applied magnetic field.

10. The magnetic field sensor of claim 9, wherein the respective construction comprises one or more of: a material of one or more layers of the magnetoresistance elements, a thickness of one or more layers of the magnetoresistance elements, an ordering of one or more layers of the magnetoresistance elements, and a spatial relationship of the magnetoresistance elements with respect to the applied magnetic field.

11. The magnetic field sensor of claim 1, wherein the plurality of magnetoresistance elements are coupled in a bridge configuration.

12. The magnetic field sensor of claim 1, further comprising processing circuitry responsive to a magnetic field signal generated by the plurality of magnetoresistance elements in response to the applied magnetic field and configured to provide an output signal of the magnetic field sensor indicative of the applied magnetic field.

13. The magnetic field sensor of claim 12, wherein the output signal of the magnetic field sensor is indicative of one or more of a strength of the applied magnetic field, an angle of speed and/or direction of the applied magnetic field, a current associated with the applied magnetic field, and a movement of a ferromagnetic element that affects the applied magnetic field.

14. The magnetic field sensor of claim 1, wherein the magnetic field sensor is a current sensor.

15. The magnetic field sensor of claim 1, further comprising processing circuitry responsive to a plurality of magnetic field signals, each generated by a respective one or more of the plurality of magnetoresistance elements in response to the applied magnetic field and configured to provide an output signal of the magnetic field sensor indicative of the applied magnetic field.

16. The magnetic field sensor of claim 15, wherein the output signal of the magnetic field sensor is indicative of one or more of a strength of the applied magnetic field, an angle of the applied magnetic field, a current associated with the applied magnetic field, and a speed and/or direction of movement of a ferromagnetic element that affects the applied magnetic field.

17. The magnetic field sensor of claim 1, wherein the plurality of magnetoresistance elements comprise one or more of a giant magnetoresistance (GMR) element, a magnetic tunnel junction (MTJ) element and a tunneling magnetoresistance (TMR) element.

18. The magnetic field sensor of claim 1, wherein the plurality of magnetoresistance elements comprise an anisotropic magnetoresistance (AMR) element.

19. The magnetic field sensor of claim 1, further comprising a plurality of current sources, each coupled to one or more of the plurality of magnetoresistance elements.

20. The magnetic field sensor of claim 1, further comprising a controller configured to sample an output of each magnetoresistance element and provide an output signal as long as the outputs of each of the magnetoresistance elements respond in a similar manner to the applied magnetic field.

21. A method comprising providing each of a plurality of magnetoresistance elements with at least one characteristic selected to provide a respective, different response to an applied magnetic field, wherein each of the plurality of magnetoresistance elements is coupled in parallel, wherein a width of a first one of the plurality of magnetoresistance elements is different than and a multiple of a width of a second one of the plurality of magnetoresistance elements, and wherein a length of the first one of the plurality of magnetoresistance elements is the same as a length of the second one of the plurality of magnetoresistance elements.

22. The method of claim 21, wherein providing each of a plurality of magnetoresistance elements comprises providing each of the plurality of magnetoresistance elements with a response to the applied magnetic field that differs in linearity.

23. The method of claim 21, wherein providing each of a plurality of magnetoresistance elements comprises providing at least one magnetoresistance element that experiences a non-linear response to the applied magnetic field.

24. The method of claim 23, wherein providing each of a plurality of magnetoresistance elements comprises providing at least two magnetoresistance elements that experience a non-linear response to the applied magnetic field.

25. The method of claim 21, wherein providing each of a plurality of magnetoresistance elements comprises coupling the plurality of magnetoresistance elements in a bridge configuration.

26. The method of claim 21, further comprising providing a plurality of current sources, each coupled to one or more of the plurality of magnetoresistance elements.

27. The method of claim 21, further comprising sampling an output of each magnetoresistance element and providing an output signal as long as the outputs of each of the magnetoresistance elements respond in a similar manner to the applied magnetic field.

* * * * *

UNITED STATES PATENT AND TRADEMARK OFFICE
CERTIFICATE OF CORRECTION

PATENT NO. : 10,330,745 B2
APPLICATION NO. : 16/136692
DATED : June 25, 2019
INVENTOR(S) : Jeffrey Eagen et al.

Page 1 of 1

It is certified that error appears in the above-identified patent and that said Letters Patent is hereby corrected as shown below:

In the Specification

Column 3, Line 48 delete "providing the each of" and replace with --providing each of--.

Column 4, Line 65 delete "having a having" and replace with --having a--.

Column 6, Line 44 delete "with the with parallel" and replace with --with the parallel--.

Column 6, Line 56 delete "be disposed a" and replace with --be disposed on a--.

Column 9, Line 31 delete "based on type of" and replace with --based on the type of--.

Signed and Sealed this
Twenty-fourth Day of December, 2019

Andrei Iancu
*Director of the United States Patent and Trademark Office*